United States Patent
Lee

(10) Patent No.: US 9,607,711 B1
(45) Date of Patent: Mar. 28, 2017

(54) SEMICONDUCTOR MEMORY DEVICE AND OPERATING METHOD THEREOF

(71) Applicant: SK hynix Inc., Gyeonggi-do (KR)

(72) Inventor: Jung Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/173,384

(22) Filed: Jun. 3, 2016

(30) Foreign Application Priority Data

Dec. 31, 2015 (KR) .......................... 10-2015-0190813

(51) Int. Cl.
*G11C 11/34* (2006.01)
*G11C 16/34* (2006.01)
*G11C 16/04* (2006.01)
*G11C 16/10* (2006.01)

(52) U.S. Cl.
CPC ...... *G11C 16/3459* (2013.01); *G11C 16/0483* (2013.01); *G11C 16/10* (2013.01)

(58) Field of Classification Search
CPC .......... G11C 16/10; G11C 16/12; G11C 16/30

USPC ....................................... 365/185.18, 185.19
See application file for complete search history.

(56) References Cited

U.S. PATENT DOCUMENTS

2011/0286265 A1* 11/2011 Mokhlesi ............ G11C 11/5628
365/185.02

FOREIGN PATENT DOCUMENTS

KR    1020140079913        6/2014

* cited by examiner

*Primary Examiner* — Son Dinh
(74) *Attorney, Agent, or Firm* — IP & T Group LLP

(57) ABSTRACT

There are provided a semiconductor memory device and an operating method thereof. A semiconductor memory device includes a memory cell array including a plurality of memory strings, a peripheral circuit for performing a program operation on the plurality of memory strings, and a control logic for controlling the peripheral circuit to apply a program voltage increased by at least two steps to a selected word line among a plurality of word lines connected to the plurality of memory strings and sequentially apply an initial setting voltage and a pass voltage to word lines adjacent to the selected word line, wherein the initial setting voltage is decreased as the program voltage is increased.

20 Claims, 9 Drawing Sheets

SEMICONDUCTOR MEMORY DEVICE AND OPERATING METHOD THEREOF

CROSS-REFERENCE TO RELATED APPLICATION

The present application claims a priority to Korean patent application number 10-2015-0190813 filed on Dec. 31, 2015, which is incorporated herein by reference in its entirety.

BACKGROUND

1. Field

An aspect of the present disclosure relates generally to a semiconductor memory device and an operating method thereof.

2. Description of the Related Art

Semiconductor memory devices are generally classified into volatile memory devices and nonvolatile memory devices.

A non-volatile memory device performs a read/write operation at a relatively lower speed than a volatile memory device, but, unlike a volatile memory device, retains stored data even when power supply to the device is cut off. Accordingly, a non-volatile memory device is used to store data to be retained regardless of a power supply. Examples of a non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are widely used and may be classified into NOR and NAND flash memories.

The flash memories have an advantage of a RAM in which data is freely programmed and erased, and an advantage of the ROM in which stored data is retained even when a power supply is cut off. The flash memories are widely used as a storage medium of portable electronic devices, such as a digital camera, a personal digital assistant (PDA), and an MP3 player.

Program characteristics of a plurality of memory cells included in the flash memory may be different from each other. For example, since magnitudes of threshold voltages increasing according to the same program voltage are different from each other, fast cells programmed at fast speed and slow cells programmed at slow speed may exist in a program operation of the flash memory. The width of a threshold voltage distribution width of a flash memory is therefore widened by the presence of fast and slow cells.

SUMMARY

Embodiments provide a semiconductor memory device and an operating method thereof, which can control program speeds of memory cells to be equal in a program operation of the semiconductor memory device, thereby improving the threshold voltage distribution of the memory cells.

According to an aspect of the present disclosure, there is provided a semiconductor memory device, including: a memory cell array configured to include a plurality of memory strings; a peripheral circuit configured to perform a program operation on the plurality of memory strings; and a control logic configured to control the peripheral circuit to apply a program voltage increased by at least two steps to a selected word line among a plurality of word lines connected to the plurality of memory strings and sequentially apply an initial setting voltage and a pass voltage to word lines adjacent to the selected word line, wherein the initial setting voltage is decreased as the program voltage is increased.

According to an aspect of the present disclosure, there is provided a method of operating a semiconductor memory device, the method including: consecutively applying a first pass voltage and a program voltage to a selected word line among a plurality of word lines; and consecutively applying an initial setting voltage and a second pass voltage to word lines adjacent to the selected word line, wherein the initial setting voltage is decreased as the program voltage is increased.

According to an aspect of the present disclosure there is provided a semiconductor memory device, including: a memory cell array configured to include a plurality of memory strings; a peripheral circuit configured to perform a program operation on the plurality of memory strings; and a control logic configured to control the peripheral circuit to sequentially apply an initial setting voltage and a program voltage to a selected word line among a plurality of word lines connected to the plurality of memory strings and sequentially apply a first pass voltage and a second pass voltage to word lines adjacent to the selected word line, wherein the initial setting voltage is increased as the program voltage is increased.

DETAILED DESCRIPTION

Figure 1:
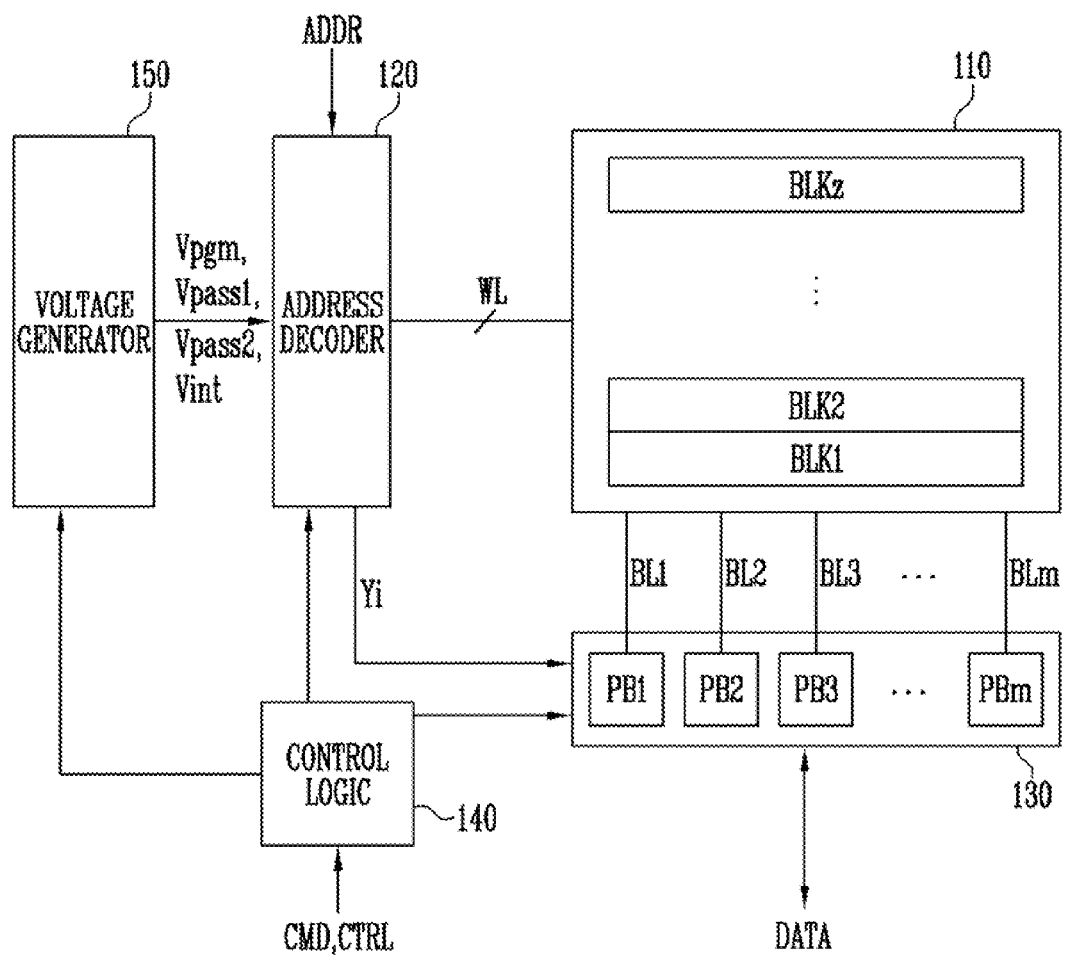
FIG. 1 is a block diagram illustrating a semiconductor memory device, according to an embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and related description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

In the drawing figures, dimensions may be exaggerated for clarity of illustration. It are understood that when an element is referred to as being "between" two elements, it can be the only element between the two elements, or one or more intervening elements may also be present. Like reference numerals refer to like elements throughout.

Referring now to FIG. 1 a semiconductor memory device 100 is provided, according to an embodiment of the present disclosure.

According to the embodiment of FIG. 1, the semiconductor memory device 100 may include a memory cell array 110, an address in decoder 120, a read/write circuit 130, a control logic 140, and a voltage generator 150.

The memory cell array 110 may include a plurality of memory blocks BLK1 to BLKz. The plurality of memory blocks BLK1 to BLKz are connected to the address decoder 120 through word lines L. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one page. For example, the memory cell array 110 may configured with a plurality of pages.

Each of the plurality of memory blocks BLK1 to BLKz in the memory cell array 110 may include a plurality of memory strings. The plurality of memory strings included in the memory cell array 110 may have different distances from the address decoder 120 according to their arrangement positions, and therefore, the word lines connecting the address decoder 120 and the memory strings may have different lengths. For example, a word line connecting the address decoder 120 and a memory string adjacent thereto has a shorter length than a word line connecting the address decoder 120 and a memory string distant therefrom. Thus, the memory strings may correspond to different word line resistance values. Accordingly, although a program voltage is applied to the word lines in a program operation, the program speed of memory cells included in a memory string adjacent to the address decoder 120 is faster than the program speed of memory cells included in a memory string relatively distant from the address decoder 120.

Each of the plurality of memory strings may include a drain select transistor, a plurality of memory cells, and a source select transistor, which may be connected in series between a bit line and a source line. Detailed description of the memory cell array 110 provided later with reference to FIG. 3.

The address decoder 120, the read/write circuit 130, and the voltage generator 140 may operate as peripheral circuits for driving the memory cell array 110.

The address decoder 120 may be connected to the memory cell array 110 through the word lines WL. The address decoder 120 may be configured to operate in response to control of the control logic 140. The address decoder 120 may receive an address ADDR through an input/output buffer (not shown) inside the semiconductor memory device 100.

For example, the address decoder 120 decodes a row address in a received address ADDR in a program operation, and applies a plurality of operation voltages including a program voltage Vpgm, an initial setting voltage Vint, and pass voltages Vpass1 and Vpass2, which are generated by the voltage generator 150, to the plurality of memory cells and the drain and source select transistors in the memory cell array 110 according to the decoded row address.

The address decoder 120 may be configured to decode a column address in a received address ADDR in program and read operations. The address decoder 120 may then transmit the decoded column address Yi to the read/write circuit 130.

The received address ADDR in the program and read operations may include a block address, a row address, and a column address. The address decoder 120 may select one memory block and one word line according to the block address and the row address. The column address may be decoded by the address decoder 120 to be provided to the read/write circuit 130.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be connected to the memory cell array 110 through the bit lines BL1 to BLm. Each of the plurality of page buffers PB1 to PBm may control the potential of a corresponding bit line among the bit lines BL1 to BLm according to data DATA to be programmed in a program voltage applying operation during the program operation. In addition the plurality of page buffers PB1 to PBm may also perform a verify operation by sensing potential levels or current amounts of the corresponding bit lines BL1 to BLm in a program verify operation.

The read/write circuit 130 may operate in response to control of the control logic 140.

In an embodiment, the read/write circuit 130 may include page buffers (or page registers), a column select circuit, and the like.

The control logic 140 is connected to the address decoder 120, the read/write circuit 130, and the voltage generator 150. Hence, for example, the control logic 140 may receive a command CMD and a control signal CTRL through the input/output buffer (not shown) inside the semiconductor memory device 100. The control logic 140 may, for example, be configured to control overall operations of the semiconductor memory device 100 in response to the command CMD and the control signal CTRL.

According to an embodiment of the present disclosure, the control logic 140 controls the voltage generator 150 so that a program voltage Vpgm applied to a selected word line is increased by at least two steps in the program voltage applying operation during the program operation. The control logic 140 controls the voltage generator 150 so that a voltage applied to word lines adjacent to the selected word line is increased from an initial setting voltage Vint to a pass voltage Vpass2 after the initial setting voltage Vint is first applied. The control logic 140 may also control the voltage generator 150 so that the initial setting voltage Vint is gradually decreased as the program voltage Vpgm is increased. The control logic 140 may control the voltage generator 150 and the address decoder 120 so that a pass voltage Vpass1 is applied to the remaining word lines except the selected word line and the adjacent word lines.

According to another embodiment of the present disclosure, the control logic 140 may control the voltage generator 150 so that the program voltage Vpgm applied to a selected word line is increased by at least two steps in the program voltage applying operation during the program operation. For example, the control logic 140 may control the voltage generator 150 to apply the initial setting voltage Vint to the selected word line and then allows the voltage level of a voltage applied to the selected word line to be increased from the initial setting voltage Vint to the program voltage Vpgm. The control logic 140 may control the voltage generator 150 so that the initial setting voltage Vint gradually increases as the program voltage Vpgm is increased. The control logic 140 may control the voltage generator 150 so that the pass voltage Vpass2 applied to word lines adjacent to the selected word line is increased by at least two steps. The control logic 140 may control the voltage generator 150 and the address decoder 120 so that the pass voltage Vpass1 is applied to the remaining word lines except the selected word line and the adjacent word lines.

The voltage generator 150 may generate and output the program voltage Vpgm, the initial setting voltage Vint, and the pass voltages Vpass1 and Vpass2 under control of the control logic 140 in the program operation.

Figure 2:
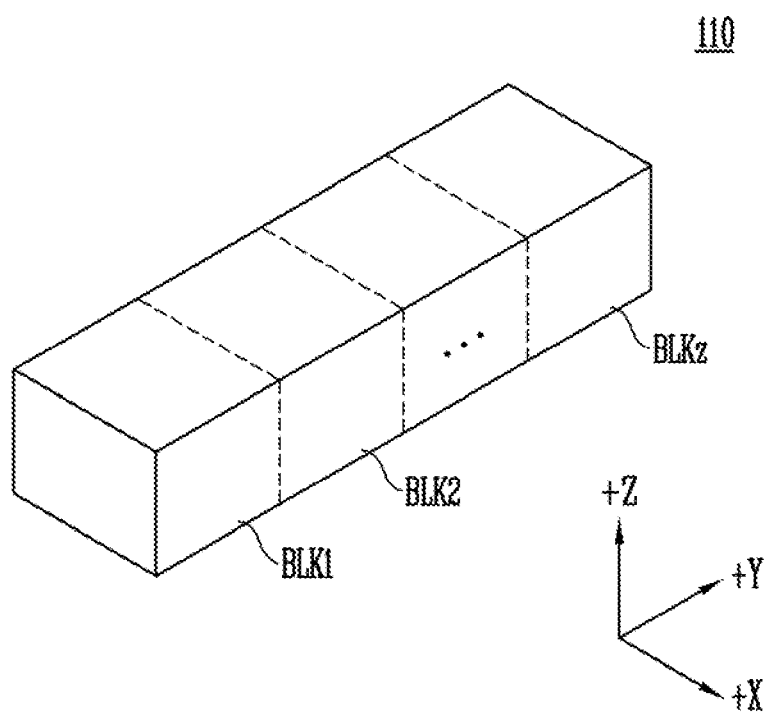
FIG. 2 is a block diagram illustrating an embodiment of a memory cell array of FIG. 1, comprising a plurality of memory blocks.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block may have a three-dimensional structure. Each memory block may include a plurality of memory cells stacked on a substrate. The plurality of memory cells may be arranged along +X, +Y, and +Z directions. The structure of each memory block are described in more detail with reference to FIG.

Figure 3:
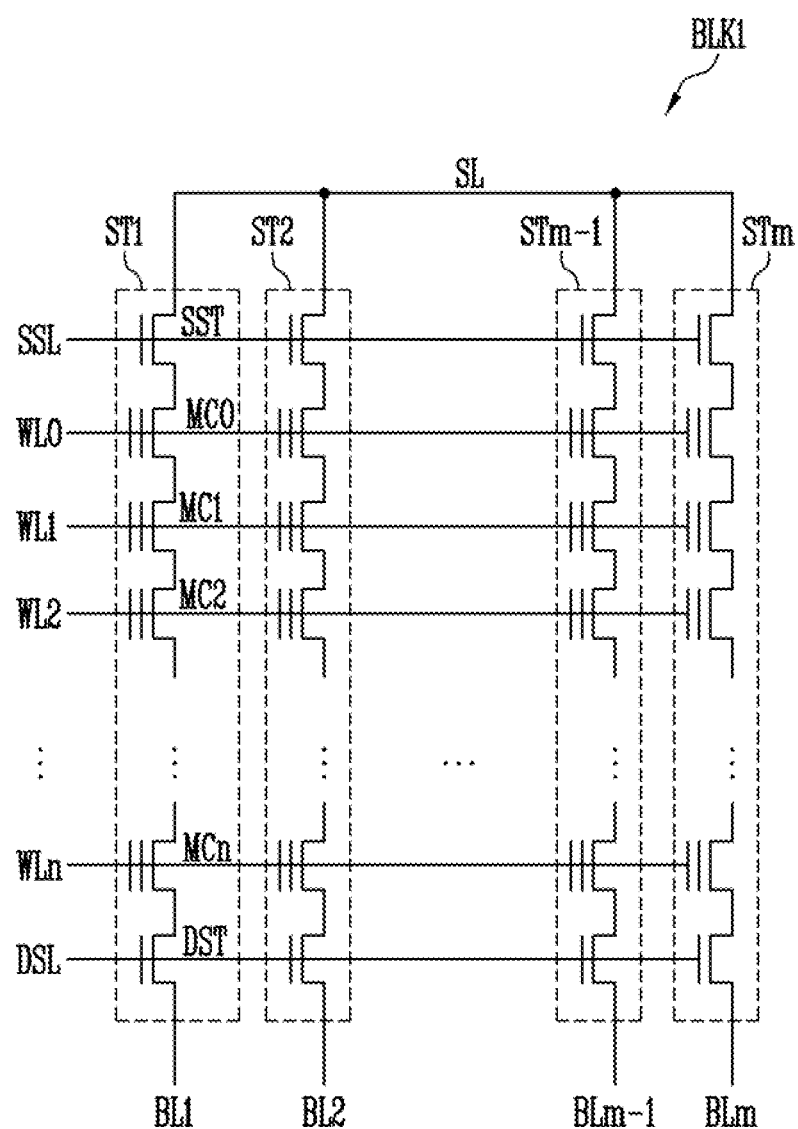
FIG. 3 is a circuit diagram illustrating a memory block of FIG. 2.

FIG. 3 is a circuit diagram illustrating a memory block of FIG. 1.

Referring to FIG. 3 the memory block BLK1 may include a plurality of cell strings ST1 to STm. Each of the plurality of cell strings ST1 to STm is connected to a plurality of bit lines BL1 to BLm.

Each of the memory strings ST1 to STm may include a source select transistor SST, a plurality of memory cells MC0 to MCn connected in series to each other, and a drain select transistor DST. The source select transistor SST is connected to a source select line SSL. The plurality of memory cells MC0 to MCn are connected to word lines WL0 to WLn, respectively. The drain select transistor DST is connected to a drain select line DSL. A source line SL is connected to a source of the source select transistor SST. Each of the bit lines BL1 to BLm is connected to a drain of a corresponding drain select transistor DST. Each of the plurality of cell strings ST1 to STm described with reference to FIG. 1 includes the source select line SSL, the word lines WL0 to WLn, and the drain select line DSL. The source select line SSL, the word lines WL0 to WLn, and the drain select line DSL are driven by the address decoder 120. Although not shown in this figure, the address decoder 120 may be disposed in one direction of the memory cell array 110. For example, the address decoder 120 may be disposed at a position adjacent to the memory string ST1. Thus, the memory string ST1 is adjacent to the address decoder 120, and hence the connection distance of the word lines WL0 to WLn to the memory string ST1 is short. On the other hand, the connection distance of the word lines WL0 to WLn to each of the memory strings ST2 to STm arranged in a direction opposite to that in which the address decoder 120 is disposed gradually increases in the opposite direction.

Figure 4:
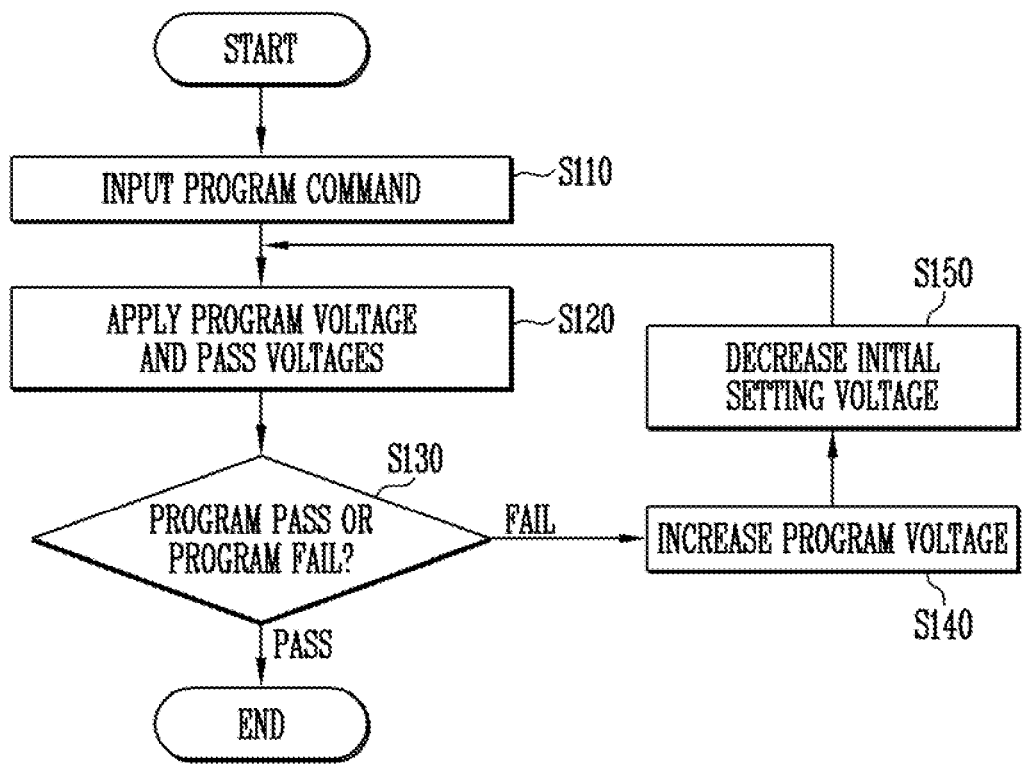
FIG. 4 is a flowchart illustrating an operating method of the semiconductor memory device, according to an embodiment of the present disclosure.

FIG. 4 is a flowchart illustrating an operating method of the semiconductor memory device, according to an embodiment of the present disclosure.

Figure 5:
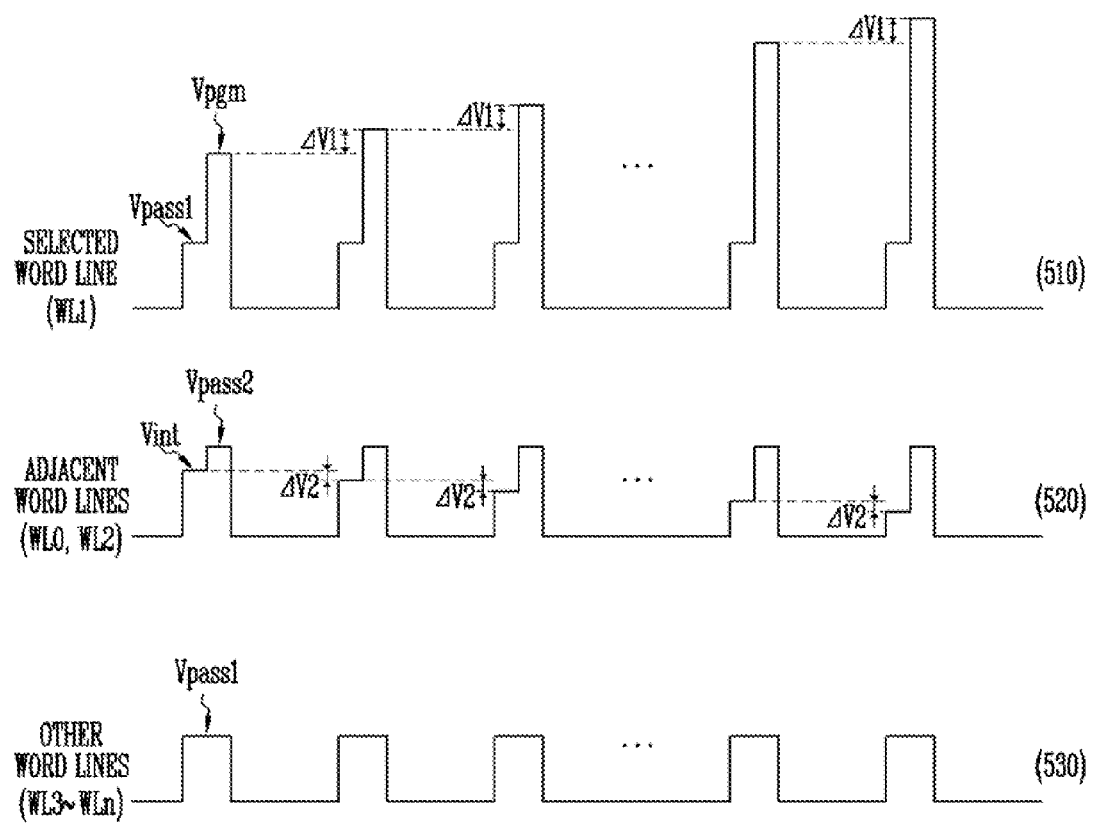
FIG. 5 is a waveform diagram of program and pass voltages, illustrating an operating method of the semiconductor device, according to the operating method of FIG. 4.

FIG. 5 is a waveform diagram of program and pass voltages, according to the operating method of FIG. 4.

A program method of the semiconductor memory device 100 according to an embodiment of the present disclosure are described as follows with reference to FIGS. 1 to 5.

1) Inputting of Program Command (S110)

If a command CMD for a program command and a control signal CTRL are received from an external device (e.g., a memory controller of a host), the control logic 140 controls the peripheral circuits so as to perform a program operation of the semiconductor memory device 100. The read/write circuit 130 arbitrarily stores data DATA to be programmed, which is received from the external device.

2) Applying of Program and Pass Voltages (S120)

The control logic 140 controls the voltage generator 150 to generate a program voltage Vpgm to be applied to a selected word line, a pass voltage Vpass2 to be applied to word lines adjacent to the selected word line, and a pass voltage Vpass1 to be applied to the remaining word lines. In an embodiment, the adjacent word lines may be one or two word lines adjacent to the selected word line. In another embodiment, the adjacent word lines may be an appropriately determined number of (i.e., one or two or more) word lines adjacent to the selected word line. For example, if WL1 is the selected word line, WL0 and WL2 may be defined as the adjacent word lines according to one embodiment.

In this state, the address decoder 120 and the voltage generator 150 first apply the pass voltage Vpass1 to the selected word line WL1 and then increase the applied pass voltage Vpass1, so that the program voltage Vpgm is applied to the selected word line WL1 (510 in FIG. 5). Thus, although lengths of the word line WL1 to which the memory cells MC1 are connected are different according to the respective distances of the memory cells MC1 from the address decoder 120, the program voltage Vpgm is increased by at least two steps, so that the difference in potential level according to loading values of the word line WL1 is decreased. For example, the potential level of a voltage applied to the selected word line WL1 is increased by a predetermined level by applying the pass voltage Vpass1 to the selected word line WL1 and then increased from the potential level of the pass voltage Vpass1 to the potential level of the program voltage Vpgm, so that the potential level can be gradually increased by a plurality of steps. Accordingly, it is possible to decrease the difference in potential level according to loading values of the word line WL1.

In addition, the address decoder 120 and the voltage generator 150 first apply an initial setting voltage Vint to the adjacent word lines WL0 and WL2 and then increase the applied initial setting voltage Vint, so that the pass voltage Vpass2 is applied to the adjacent word lines WL0 and WL2 (520 in FIG. 5). The time when the initial setting voltage Vint which is applied to the adjacent word lines WL0 and WL2 is increased to the pass voltage Vpass2 may be equal to the time when the pass voltage Vpass1 applied to the selected word line WL1 is increased to the program voltage Vpgm.

The initially applied initial setting value Vint may have the same potential level as the pass voltage Vpass1. The pass voltage Vpass2 may have a higher potential level than the pass voltage Vpass1 applied to the remaining word lines WL3 to WLn. For example, since the pass voltage Vpass2 which has a relatively high potential level is applied to the word lines WL0 and WL2 (which are adjacent to the selected word line WL1), the pass voltage Vpass1 which is applied to the selected word line WL1 is easily increased to the potential level of the program voltage Vpgm due to a coupling phenomenon, and thus the program voltage Vpgm can be equally applied to a memory cell adjacent to the address decoder 120 and a memory cell relatively distant from the address decoder 120.

3) Program Verify Operation (S130)

The plurality of page buffers PB1 to PBm of the read/write circuit 130 may sense the potential levels or potential amounts of corresponding bit lines BL1 to BLm, and determine whether the selected memory cells MC1 connected to the corresponding bit lines BL1 to BLm have been programmed to a voltage equal to or greater than a threshold voltage value corresponding to program data.

When the selected memory cells MC1 are all determined as program pass, the program operation is ended.

4) Increasing the Program Voltage (S140)

When some of the selected memory cells are determined as program fail as a result of the aforementioned program verify operation (S130) the potential level of the program voltage Vpgm is reset at an increased value by adding a first step voltage ΔV1 (510 in FIG. 5).

5) Decreasing the Initial Setting Voltage (S150)

After the increasing of the program voltage (S140) the initial setting voltage Vint is reset by being decreased by a second step voltage ΔV2 (520 in FIG. 5). The second step voltage ΔV2 may have a lower voltage value than the first step voltage ΔV1.

For example, as a program loop including the program voltage applying operation and the program verify operation iterated, the program voltage Vpgm is increased by the first step voltage ΔV1, and the initial setting voltage Vint is decreased by the second step voltage ΔV2.

After the program voltage Vpgm and the initial setting voltage Vint are reset, the program method is repeated from the step of applying the program voltage and the pass voltages (S120).

As described above, in the program operation using an incremental step pulse program (ISPP) method, the difference in potential level is increased, where the pass voltage app led to the selected word line WL1, by increasing the program voltage Vpgm by the first step voltage ΔV1 to a new program voltage Vpgm. Thus, the potential level of the initial setting voltage Vint is reset by being decreased by the second step voltage ΔV2, so that the difference in potential level can be increased, where the initial setting voltage Vint applied to the adjacent word lines WL0 and WL2 is increased to the pass voltage Vpass2. Accordingly, the difference in potential level is increased, where the pass voltage Vpass1 is increased to the program voltage Vpgm, so that it is possible to prevent a decrease in the effect that the potential level of a voltage applied to the selected word line WL1 is boosted by the coupling phenomenon caused by the pass voltage Vpass2 applied to the adjacent word lines WL0 and WL2.

Figure 6:
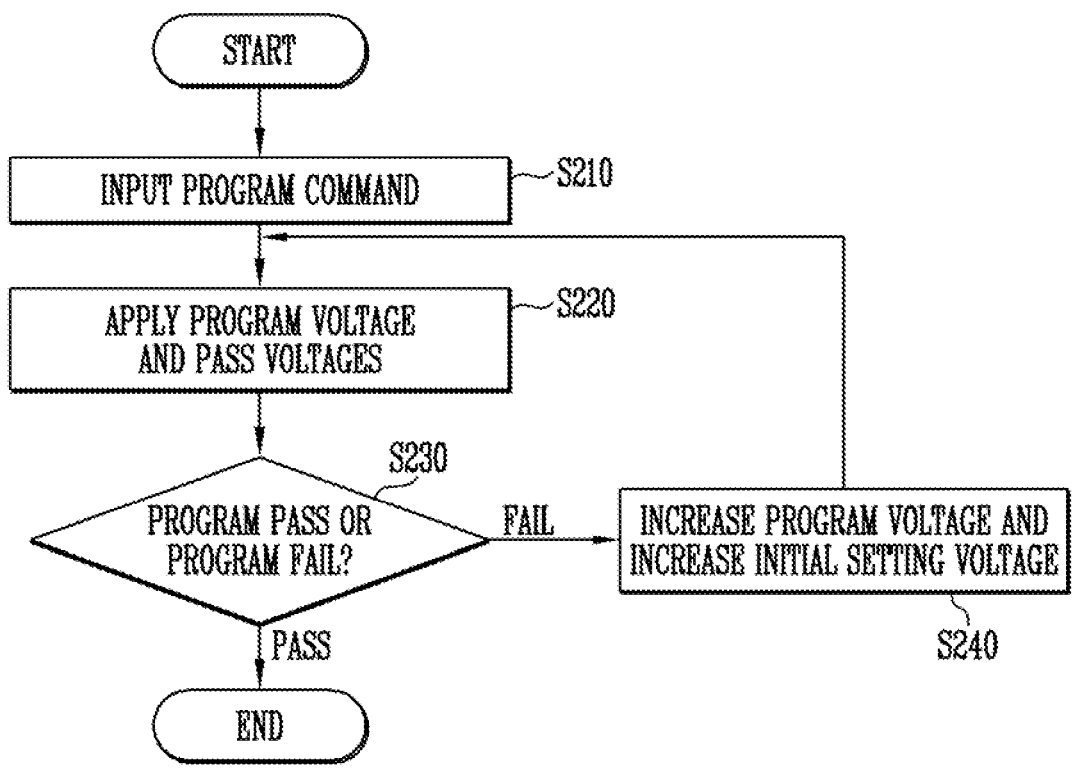
FIG. 6 is a flowchart illustrating an operating method of the semiconductor memory device, according to another embodiment of the present disclosure.

FIG. 6 is a flowchart illustrating an operating method of the semiconductor memory device, according to another embodiment of the present disclosure.

Figure 7:
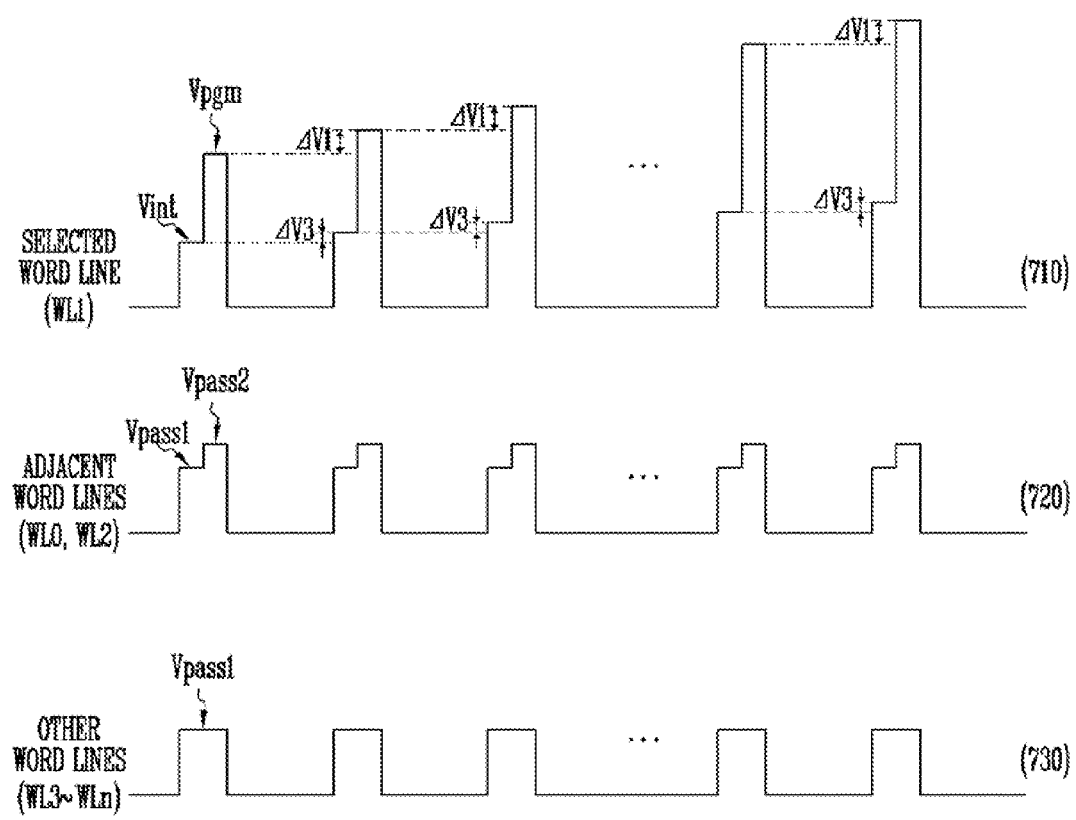
FIG. 7 is a waveform diagram of program and pass voltages, according to the operating method of FIG. 6.

FIG. 7 is a waveform diagram illustrating program and pass voltages in the operating method of FIG. 6.

A program method of the semiconductor memory device 100 according to another embodiment of the present disclosure are described as follows with reference to FIGS. 1 to 3, 6, and 7.

1) Inputting of Program Command (S210)

If a command CMD for a program command and a control signal CTRL are inputted from the external (e.g., a memory controller of a host), the control logic 140 controls the peripheral circuits so as to perform a program operation of the semiconductor memory device 100. The read/write circuit 130 arbitrarily stores data DATA to be programmed, which is inputted from the external device.

2) Applying the Program and Pass Voltages (S220)

The control logic 140 controls the voltage generator 150 to generate a program voltage Vpgm to be applied to a selected word line (e.g., WL1), a pass voltage Vpass2 to be applied to adjacent word lines (e.g., WL0 and WL2) adjacent to the selected word line (e.g., WL1), and a pass voltage Vpass1 to be applied to the remaining word lines (e.g., WL3 to WLn).

In this state, the address decoder 120 and the voltage generator 150 first apply an initial setting voltage Vint to the selected word line WL1 and then increase the applied initial setting voltage Vint, so that the program voltage Vpgm is applied to the selected word line WL1 (710 in FIG. 7). Thus, although lengths of the word line WL1 to which the memory cells MC1 are connected are different according to distances of the memory cells MC1 from the address decoder 120, the program voltage Vpgm is increased by at least two steps, so that the difference in potential level, according to the loading values of the word line WL1 is decreased.

In addition, the address decoder 120 and the voltage generator 150 first apply the pass voltage Vpass1 to the adjacent word lines WL0 and WL2 and then increase the applied pass voltage Vpass1, so that the pass voltage Vpass2 is applied to the adjacent word lines WL0 and WL2 (720 in FIG. 7). The timing when the pass voltage Vpass1 applied to the adjacent word lines WL0 and WL2 is increased to the pass voltage Vpass2 may be equal to that when the initial setting voltage Vint applied to the selected word, line WL1 is increased to the program voltage Vpgm.

The initially applied initial setting value Vint may have the same potential level as the pass voltage Vpass1. The pass voltage Vpass2 may have a higher potential level than the pass voltage Vpass1 applied to the remaining word lines WL3 to WLn. For example since the pass voltage Vpass2 having a relatively high potential level is applied to the word lines WL0 and WL2 adjacent to the selected word line WL1, the initial setting voltage Vint applied to the selected word line WL1 is easily increased to the potential level of the program voltage Vpgm due to a coupling phenomenon, and thus the program voltage Vpgm can be equally applied to a memory cell adjacent to the address decoder 120 and a memory cell relatively distant from the address decoder 120.

3) Program Verify Operation (S230)

The plurality of page buffers PB1 to PBm of the read/write circuit 130 sense potential levels or potential amounts of corresponding bit lines BL1 to BLm, and determine whether the selected memory cells MC1 connected to the corresponding bit lines BL1 to BLm have been programmed to a voltage equal to or greater than a threshold voltage value corresponding to program data.

When the selected memory cells MC1 are all determined as program pass the program operation is ended.

4) Increasing the Program Voltage & Increasing the Initial Setting Voltage (S240)

When some of the selected memory cells are determined as program fail as a result of the above-described program verify operation (S230), the potential level of the program voltage Vpgm is reset by being increased by a first step voltage ΔV1 (710 in FIG. 7). Also, the potential level of the initial setting voltage Vint is reset by being increased by a third step voltage ΔV3 (710 in FIG. 7). The third step voltage ΔV3 may have a lower voltage value than the first step voltage ΔV1.

After the program voltage Vpgm and the initial setting voltage Vint are reset, the program method is repeated from the step of the applying of the program voltage and the pass voltage (S220).

As described above, in the program operation using the ISPP method, although the program voltage Vpgm is increased by the first step voltage ΔV1, the initial setting voltage Vint is increased by the third step voltage ΔV3, so that the difference in potential level, where the initial setting voltage Vint is increased to the program voltage Vpgm, can be equally maintained, or so that it is possible to control the increment in the difference in potential level.

Accordingly, the difference in potential level is increased, where the initial setting voltage Vint is increased to the program voltage Vpgm, so that it is possible to prevent a decrease in the effect that the potential level of a voltage applied to the selected word line WL1 is boosted by the coupling phenomenon caused by the pass voltage Vpass2 applied to the adjacent word lines WL0 and WL2.

Although not clearly described for convenience of illustration in the above-described embodiments the pass voltage Vpass1 applied to the adjacent word lines WL0 and WL2 may be gradually decreased as shown in the embodiment of FIG. 5 while gradually increasing the initial setting voltage Vint applied to the selected word line WL1 as the program loop is repeated as shown in the embodiment of FIG. 7.

Figure 8:
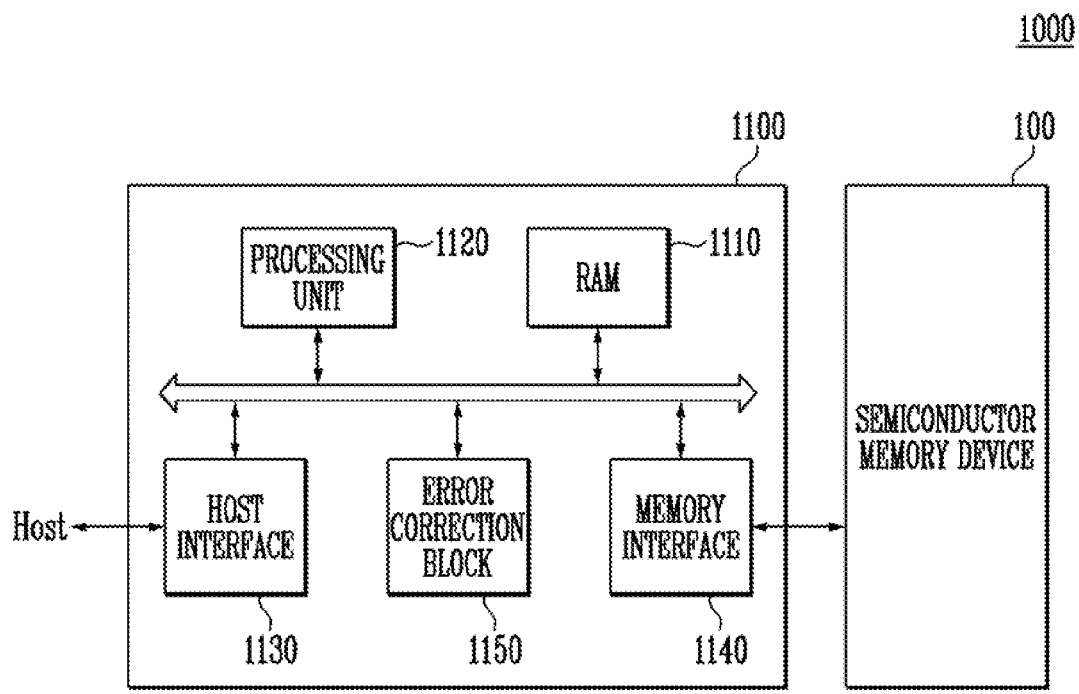
FIG. 8 is a block diagram illustrating a memory system including the semiconductor memory device of FIG. 1 according to an embodiment of the present disclosure.

FIG. 8 is a block diagram illustrating a memory system 1000 including the semiconductor memory device of FIG. 1, according to an embodiment of the invention.

According to the embodiment of FIG. 8, the memory system 1000 may include a semiconductor memory device 100 and a controller 1100.

The semiconductor memory device 100 may be identical to the semiconductor memory device described with reference to FIG. 1. Hence, hereinafter, overlapping descriptions are omitted.

The controller 1100 is connected to a host and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 100 is configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host, and a buffer memory between the semiconductor memory device 100 and the host. The processing unit 1120 controls overall operations of the controller 1100. Also, the controller 1100 may arbitrarily store program data provided from the host in a write operation.

The host interface 1130 may include a protocol for exchanging data between the host and the controller 1100. In an embodiment the controller 1100 is configured to communicate with the host through at least one interface protocol, such as, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 may be configured to detect and correct data errors received from the semiconductor memory device 100 by using an error correction code (ECC). The processing unit 1120 may control the semiconductor memory device 100 to adjust a read voltage, based on an error detection result of the error correction block 1150, and to perform re-reading. In an embodiment, the error correction block 1150 may be provided as a component of the controller 1100.

The controller 1100 and the semiconductor memory device 100 may be integrated into one semiconductor device. In an embodiment the controller 1100 and the semiconductor memory device 100 may be integrated into one semiconductor device, to constitute a memory card. For example, the controller 1100 and the semiconductor memory device 100 may be integrated into one semiconductor device, to constitute a memory card, such as, for example, a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive, e.g., a solid state drive SSD. The semiconductor drive SSD may include a storage device configured to store data in a semiconductor memory. If the memory system 1000 is used as the semiconductor drive SSD, the operating speed of the host connected to the memory system 1000 can be improved significantly.

As another example, the memory system 1000 may be provided as a component of an electronic device, such as, for example, a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms including, for example, package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP) thin quad flat pack (TQFP), system in package (SIP), multi chip package (MCP), wafer-level fabricated package (WFP), or wafer-level processed stack package (WSP).

Figure 9:
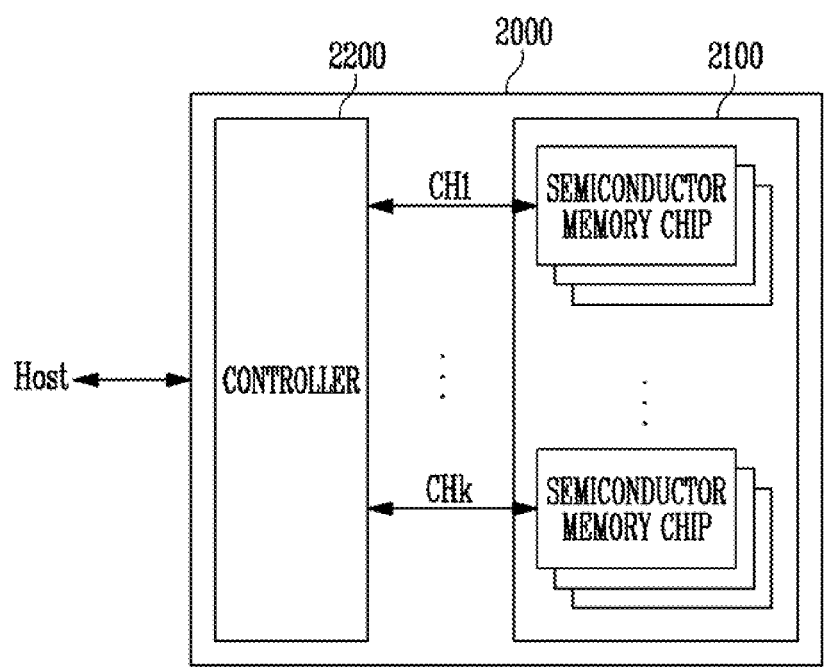
FIG. 9 is a block diagram illustrating an application example of the memory system of FIG. 8, according to an embodiment of the present disclosure.

FIG. 9 is a block diagram illustrating an application example of the memory system 2000 of FIG. 8, according to an embodiment of the invention.

According to the embodiment of FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicate with the controller 2200 through first to kth channels CH1 to CHk. Each semiconductor memory chip may be configured and operated like the semiconductor memory device 100 described with reference to FIG. 1.

Each group may be configured to communicate with the controller 2200 through one common channel. The controller 2200 may be configured similarly to the controller 1100 as described with reference to FIG. 7. The controller 2200 may be configured to control the plurality of memory chips of the semiconductor memory device 2100 through the plurality of channels CH1 to CHk.

Figure 10:
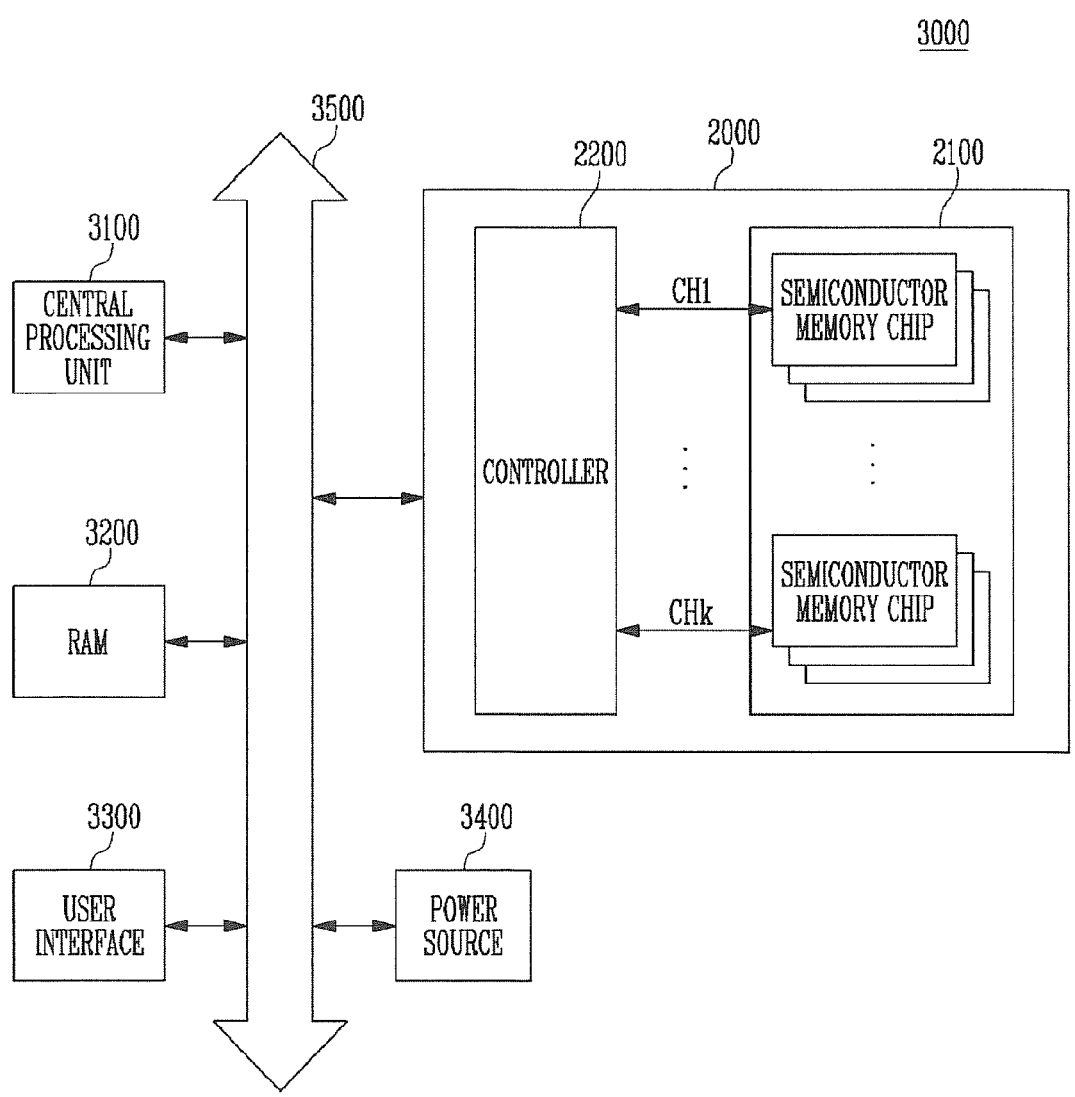
FIG. 10 is a block diagram illustrating a computing system including the memory system described with reference to FIG. 9, according to an embodiment of the present disclosure.

FIG. 10 is a block diagram illustrating a computing system 3000 including the memory system described with reference to FIG. 9, according to an embodiment of the present invention.

Referring to FIG. 10, the computing system 300 may include a central processing unit 3100, a random access memory (RAM) 3200, a user interface 3300, a power source 3400, a system bus 3500, and a memory system 2000.

The memory system 2000 may be electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 10, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 10, it is illustrated that the memory system 2000 described with reference to FIG. 9 is provided. However, the memory system 2000 may be replaced by the memory system 1000 described with reference to FIG. 8. In an embodiment, the computing system 3000 may be configured to include both the memory systems 1000 and 2000 described with reference to FIGS. 8 and 9.

According to the present disclosure, program speeds of memory cells are controlled to be equal in a program operation of the semiconductor memory device, thereby improving the threshold voltage distribution of the memory cells.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, as it will be understood by those skilled in the relevant art, various changes in form and details may be made without departing from the spirit and or scope of the present disclosure as set forth in the following claims.

What is claimed is:

1. A semiconductor memory device, comprising:
   a memory cell array including a plurality of memory strings;
   a peripheral circuit suitable for performing a program operation on the plurality of memory strings; and
   a control logic suitable for controlling the peripheral circuit to apply a program voltage increased by at least two steps to a selected word line among a plurality of word lines connected to the plurality of memory strings and sequentially apply an initial setting voltage and a pass voltage to word lines adjacent to the selected word line,
   wherein the initial setting voltage is decreased as the program voltage is increased.

2. The semiconductor memory device of claim 1, wherein the peripheral circuit includes a voltage generator suitable for generating a first pass voltage and the program voltage, which are to be applied to the selected word line, the initial setting voltage and a second pass voltage, which are to be applied to the adjacent word lines and the first pass voltage to be applied to the remaining word lines among the plurality of word lines except the selected word line and the adjacent word lines.

3. The semiconductor memory device of claim 2, wherein the second pass voltage is higher than the first pass voltage.

4. The semiconductor memory device of claim 2, wherein the voltage generator applies the first pass voltage to the selected word line and then increases the first pass voltage to a potential level of the program voltage to be applied to the selected word line, and
   wherein the voltage generator applies the initial setting voltage to the adjacent word lines and then increases the initial setting voltage to a potential level of the second pass voltage to be applied to the adjacent word lines.

5. The semiconductor memory device of claim 4, wherein the timing when the first pass voltage is increased to the program voltage which is equal to the voltage when the initial setting voltage is increased to the second pass voltage.

6. The semiconductor memory device of claim 1, wherein the program voltage is increased by a first step voltage value as a program loop is performed, and the initial setting value is decreased by a second step voltage value as the program loop is performed.

7. The semiconductor memory device of claim 6, wherein the second step voltage value is equal to or lower than the first step voltage value.

8. A method of operating a semiconductor memory device, the method comprising:
   consecutively applying a first pass voltage and a program voltage to a selected word line among a plurality of word lines; and consecutively applying an initial setting voltage and a second pass voltage to word lines adjacent to the selected word line, wherein the initial setting voltage is decreased as the program voltage is increased.

9. The method of claim 8, further comprising applying the first pass voltage to the remaining word lines among the plurality of word lines except the selected word line and the adjacent word lines.

10. The method of claim 8, wherein the second pass voltage is higher than the first pass voltage.

11. The method of claim 8, further comprising, after the program voltage is applied to the selected word line and the second pass voltage is applied to the adjacent word lines performing a program verify operation.

12. The method of claim 11, further comprising, when memory cells connected to the selected word line are determined as program fail as a result of the program verify operation, setting a new program voltage by increasing the program voltage by a first step voltage value.

13. The method of claim 12, further comprising, after the setting of the new program voltage, setting a new initial setting value by decreasing the initial setting value by a second step voltage value.

14. The method of claim 13, wherein the second step voltage value is equal to or lower than the first step voltage value.

15. A semiconductor memory device comprising:
a memory cell array including a plurality of memory strings;
a peripheral circuit suitable for performing a program operation on the plurality of memory strings; and
a control logic suitable for controlling the peripheral circuit to sequentially apply an initial setting voltage and a program voltage to a selected word line among a plurality of word lines connected to the plurality memory strings and sequentially apply a first pass voltage and a second pass voltage to word lines adjacent to the selected word line,
wherein the initial setting voltage is increased as the program voltage is increased.

16. The semiconductor memory device of claim wherein the second pass voltage is higher than the first pass voltage.

17. The semiconductor memory device of claim 15, wherein the program voltage is increased by a first step voltage value as a program loop is performed, and the initial setting value is increased by a second step voltage value as the program loop is performed.

18. The semiconductor memory device of claim 17, wherein the second step voltage value is equal to or lower than the first step voltage value.

19. The semiconductor memory device of claim 15, wherein the peripheral circuit applies the initial setting voltage to the selected word line and then increases the initial setting voltage to a potential level of the program voltage to be applied to the selected word line, and
wherein the peripheral circuit applies the first pass voltage to the adjacent word lines and then increases the first pass voltage to a potential level of the second pass voltage to be applied to the adjacent word lines.

20. The semiconductor memory device of claim 19, wherein the timing when the initial setting voltage is increased to the program voltage is equal to that when the first pass voltage is increased to the second pass voltage.

* * * * *